(12) United States Patent
Hwang et al.

(10) Patent No.: US 12,476,658 B2
(45) Date of Patent: Nov. 18, 2025

(54) APPARATUS AND METHOD FOR DESIGNING CODES BY USING POLAR AND ALGEBRAIC CODES

(71) Applicant: ELECTRONICS AND TELECOMMUNICATIONS RESEARCH INSTITUTE, Daejeon (KR)

(72) Inventors: In Ki Hwang, Daejeon (KR); Hun Sik Kang, Daejeon (KR); Joon Ki Lee, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 18 days.

(21) Appl. No.: 18/590,531

(22) Filed: Feb. 28, 2024

(65) Prior Publication Data

US 2024/0297666 A1    Sep. 5, 2024

(30) Foreign Application Priority Data

Mar. 2, 2023    (KR) .......................... 10-2023-0027760

(51) Int. Cl.
*H03M 13/00*    (2006.01)
*H03M 13/11*    (2006.01)

(52) U.S. Cl.
CPC ..... *H03M 13/616* (2013.01); *H03M 13/1177* (2013.01)

(58) Field of Classification Search
CPC ........... H03M 13/1177; H03M 13/616; H03M 13/13; H03M 13/132; H03M 13/2957
See application file for complete search history.

(56) References Cited

U.S. PATENT DOCUMENTS

| | | |
|---|---|---|
| 10,270,470 B2 | 4/2019 | Li et al. |
| 10,326,478 B2 | 6/2019 | Trifonov et al. |
| 2017/0353193 A1 | 12/2017 | Jang et al. |
| 2021/0036805 A1 | 2/2021 | Kim |
| 2021/0297181 A1 | 9/2021 | Park et al. |

(Continued)

FOREIGN PATENT DOCUMENTS

| | | |
|---|---|---|
| KR | 10-2013-0001494 A | 1/2013 |
| KR | 10-2017-0136239 A | 12/2017 |

OTHER PUBLICATIONS

D. Yang, M. Jang and K. Yang, "Algebraic Construction of Structurally Shaped Polar Codes," in IEEE Transactions on Communications, vol. 69, No. 9, pp. 5701-5713, Sep. 2021.*

*Primary Examiner* — Steve N Nguyen

(57) ABSTRACT

Proposed are an apparatus and a method for designing codes by using polar and algebraic codes. The operating method of the apparatus for designing a code may include a step of identifying a polar code defined as at least one information set, a step of identifying a parity matrix of the polar code, a step of identifying a vector corresponding to the polar code, a step of identifying a row that is representable in a way by linearly combining each row of the parity matrix, a step of identifying a specific binarization matrix in which the representable row does not exist, a step of generating a transformed parity matrix by adding the specific binarization matrix to the parity matrix and a step of generating a pre-code corresponding to the transformed parity matrix.

10 Claims, 4 Drawing Sheets

(56) References Cited

U.S. PATENT DOCUMENTS

| | | | |
|---|---|---|---|
| 2023/0208554 A1* | 6/2023 | Wang | H04L 1/0045 |
| | | | 370/329 |
| 2025/0015922 A1* | 1/2025 | Kim | H04L 1/0067 |
| 2025/0030501 A1* | 1/2025 | Kim | H03M 13/00 |

* cited by examiner

APPARATUS AND METHOD FOR DESIGNING CODES BY USING POLAR AND ALGEBRAIC CODES

CROSS REFERENCE TO RELATED APPLICATION

The present application claims priority to Korean Patent Application No. 10-2023-0027760, filed on Mar. 2, 2023, the entire contents of which are incorporated herein for all purposes by this reference.

BACKGROUND

Technical Field

The present disclosure relates to an error correction technique and, more specifically, to a technique for designing a code capable of efficient hard decision and soft decision decoding by mixing properties of a polar code and an algebraic code.

Description of the Related Art

Polar codes show performance that reaches the limit of information transmission efficiency when the length is infinitely large, but when the length is finite, the performance lags behind that of the existing LDPC code or turbo code. To overcome this, research has been conducted using list successive cancellation (LSC) decoding techniques and code concatenation techniques. In particular, a dramatic improvement in error correction ability has been observed through the concatenation of polar codes and CRC codes. However, it is difficult to analyze the algebraic properties of CRC-aided polar codes. The optimal combination of CRC codes changes according to the length of the code and the code rate, but there is no known way to analyze it mathematically. In general, an algebraic code is easy to analyze in terms of algebraic properties such as minimum distance or minimum distance code, but the efficient soft decoding method is not known in many cases. When an algebraic code is reinterpreted as concatenated codes with polar codes, efficient soft decoding is possible by using the LSC decoding algorithm used in the polar code. However, algebra-based codes cannot guarantee good performance since channel characteristics are not reflected, whereas code design results should reflect channel characteristics to show good performance in practical LSC decoders with a list size of 8 to 32.

SUMMARY

An objective of the present disclosure is to improve the finite length performance of a polar code for use in communication systems that require ultra-low error rates.

An objective of the present disclosure is to be utilized in situations where both hard decision decoding and soft decision decoding are simultaneously possible.

An operating method of an apparatus for designing a code according to an exemplary embodiment of the present disclosure may include a step of identifying a polar code defined as at least one information set, a step of identifying a parity matrix of the polar code, a step of identifying a vector corresponding to the polar code wherein the vector is related to at least one binarization matrix corresponding to at least one exponent, a step of identifying a row that is representable in a way by linearly combining each row of the parity matrix among at least one row constituting the binarization matrix, a step of identifying a specific binarization matrix in which the representable row does not exist among the at least one binarization matrix, a step of generating a transformed parity matrix by adding the specific binarization matrix to the parity matrix and a step of generating a pre-code corresponding to the transformed parity matrix.

In addition, the vector may be a vector representation of a polynomial representation for a codeword of the polar code and may satisfy a predetermined condition for the codeword.

In addition, the transformed parity matrix may include information on an exponent corresponding to the specific binarization matrix among the at least one exponent.

The method may further include a step of identifying a binarization matrix corresponding to the representable row among the at least one binarization matrix, a step of identifying the number of representable rows, a step of identifying the exponent of the binarization matrix corresponding to the representable row among the at least one exponent, and a step of generating a pre-code based on the identified number and the information on the exponent.

In addition, the transformed parity matrix may be generated on the basis of Equation 1

$$H'_{\mathcal{A}} = \begin{bmatrix} H_{\mathcal{A}} \\ h_b^j \end{bmatrix} \qquad \text{[Equation 1]}$$

here, $H_{\mathcal{A}}$ is the parity matrix, $h_b^j$ is the specific binarization matrix, and j may be an exponent corresponding to the specific binarization matrix among the at least one exponent.

An apparatus for designing a code according to an exemplary embodiment of the present disclosure may include a transceiver, and at least one controller that is operatively connected to the transceiver, wherein the at least one controller identifies a polar code defined as the at least one information set, identifies a parity matrix of the polar code, identifies a vector corresponding to the polar code where the vector is related to at least one binarization vector corresponding to the at least one exponent, identifies a row that is representable in a way by linearly combining each row of the parity matrix among the at least one row constituting the binarization matrix, identifies a specific binarization matrix in which the representable row does not exist among the at least one binarization matrix, generates a transformed parity matrix by adding the specific binarization matrix to the parity matrix, and generates a pre-code corresponding to the transformed parity matrix.

In addition, the vector may be a vector representation of a polynomial representation for a codeword of the polar code and may satisfy a predetermined condition for the codeword.

In addition, the transformed parity matrix may include information on an exponent corresponding to the specific binarization matrix among the at least one exponent.

The at least one controller may further identify a binarization matrix corresponding to the representable row among the at least one binarization matrix, identify the number of representable rows, identify an exponent of the binarization matrix corresponding to the representable row among the at least one exponent, and generate a pre-code based on the identified number and the information on the exponent.

In addition, the transformed parity matrix may be generated on the basis of Equation 1

$$H'_{\mathcal{A}} = \begin{bmatrix} H_{\mathcal{A}} \\ h_b^j \end{bmatrix} \quad \text{[Equation 1]}$$

here, $H_{\mathcal{A}}$ is the parity matrix, $h_b^j$ is the specific binarization matrix, and j may be an exponent corresponding to the specific binarization matrix among the at least one exponent.

The present disclosure has an advantage of improving the finite length performance of the polar code for use in a communication system that requires an ultra-low error rate.

The present disclosure has an advantage that it is used in situations where hard decision decoding and soft decision decoding are possible simultaneously.

DETAILED DESCRIPTION OF THE DISCLOSURE

Figure 1:
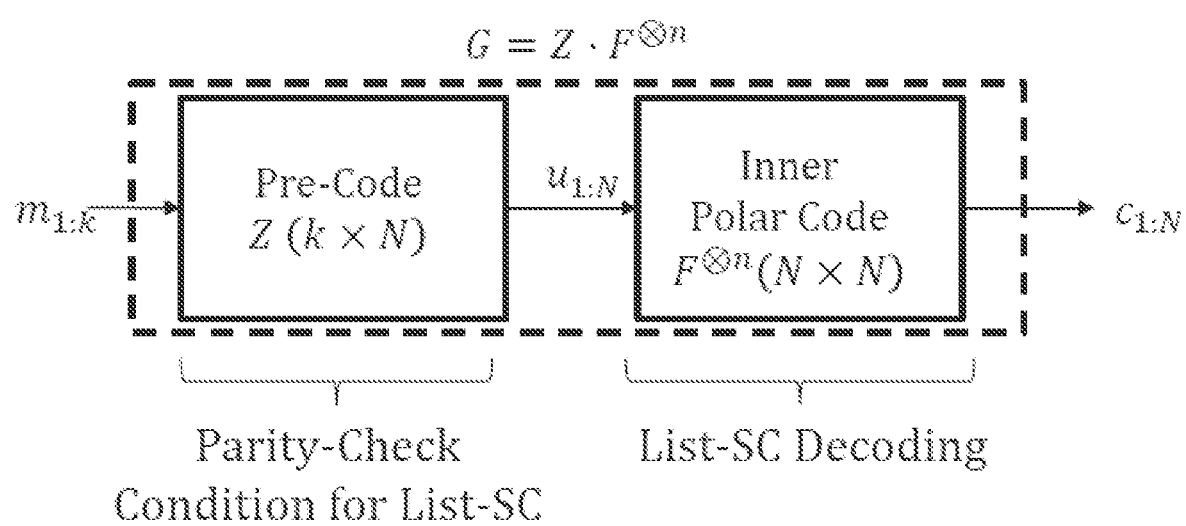
FIG. 1 shows a structure of a linear code generated by a code design apparatus according to an exemplary embodiment of the present disclosure.

Phrases such as "in some exemplary embodiments" or "in one exemplary embodiment" appearing in various places in the present specification do not necessarily refer to the same exemplary embodiment.

Some exemplary embodiments of the present disclosure may be represented by functional block configurations and various processing steps. Some or all of these functional blocks may be implemented with various numbers of hardware and/or software configurations that execute specific functions. For example, the functional blocks of the present disclosure may be implemented by one or more microprocessors or by circuit configurations for predetermined functions. In addition, for example, the functional blocks of the present disclosure may be implemented in various programming or scripting languages. Functional blocks may be implemented as algorithms executed on one or more processors. In addition, the present disclosure may employ conventional techniques for electronic environment setting, signal processing, and/or data processing. Terms such as "mechanism", "element", "means", and "configuration" may be widely used and are not limited to mechanical and physical configurations.

In addition, connecting lines or connecting members between components shown in the drawing are merely exemplary of functional connections and/or physical or circuit connections. In an actual device, connections between components may be indicated by various functional connections, physical connections, or circuit connections that are replaceable or added.

The present disclosure provides a technique for designing a code capable of efficient hard and soft decoding while expanding the minimum distance by adding a minimum parity so that a polar code includes properties of an algebraic code based on the polar code.

FIG. 1 shows a structure of a linear code generated by a code design apparatus according to an exemplary embodiment of the present disclosure.

A generator matrix G of an arbitrary linear code having a code length of N and a message length of k may be derived through Equation 1 below.

$$G = Z \cdot F^{\otimes n} \quad \text{[Equation 1]}$$

Here, Z is a pre-code matrix, and $F^{\otimes n}$ may be a polar code. The generator matrix G may be decomposed into the product of the pre-code matrix and the polar code. At this time, the matrix Z may be derived through Equation 2 below.

$$Z = G \cdot (F^{\otimes n})^{-1} \quad \text{[Equation 2]}$$

Here, the equation may be understood as $Z = G_{alg} \cdot F^{\otimes n}$ since $(F^{\otimes n})^{-1}$ is the same as $F^{\otimes n}$.

As shown in FIG. 1, when a message vector to be transmitted is $m_1^k := [m_1, m_2, \ldots, m_k]$ and the input is $u_1^N$ in the polar code of view, $u_1^N$ may be divided into three sets such as information set $\mathcal{A}$, frozen set $\mathcal{F}$, and parity set $\mathcal{P}$.

The information set may be a subset of bit positions in a codeword where bits carry original information and are not duplicated, the frozen set may be a subset of bit positions in a codeword where bits are fixed to known values (typically 0) and are not used to carry information, and the parity set may be a subset of bit positions in a codeword where bits are duplicated and used to detect and correct errors. These bits may be computed from information bits using a specific encoding algorithm. The information set, frozen set, and parity set may be used to determine the structure of the code and optimize error correction performance.

The message $m_1^k$ may be input as it is into the position corresponding to the information set, and a value fixed to 0 may be input into the frozen set. A bit generated by a single parity checksum of previous messages may be input into the parity set. The positions of the sets $\mathcal{A}$, $\mathcal{F}$, $\mathcal{P}$ and the checksum generation rule of $\mathcal{P}$ may be found by analyzing the column of the matrix Z. When the column of the matrix Z is a 0 vector, the corresponding index may be divided as a frozen set, when the column contains only one 1 and is a pivoting column, it may be divided as an information set, and when the column contains 1 more than one, it may be divided as a dynamic set. In this case, the checksum of $\mathcal{P}$ may be obtained by adding the message at the position of 1 in the corresponding column.

The present disclosure proposes a method for increasing the minimum distance of the code while including the theoretical optimal element of the information set in designing a matrix Z.

More specifically, the present disclosure may include a configuration of adding an additional parity $H_{extra}$ in order to include a continuous zero (0) spectrum of the BCH code by analyzing the parity matrix $H_{\mathcal{A}}$ of the polar code defined as the information set $\mathcal{A}$. In this case, it may be important to efficiently control the amount of additional parity since the code rate decreases though the minimum distance increases as the additional parity is larger. The present disclosure provides a technique for efficiently selecting the amount of additional parity by analyzing a zero spectrum already included in an existing polar code parity matrix.

When the primary element of the finite field $GF(2^n)$ is $\beta$ and the codeword $c=(c_0, c_1, c_2, \ldots, c_{N-1})$ of the BCH code with t error correction ability is represented as the polynomial $c(x)=c_0+c_1 x+c_2 x^2+ \ldots +c_{N-1}x^{N-1}$, $c(x)$ may satisfy Equation 3 below.

$$c(\beta) = c(\beta^2) = \ldots = c(\beta^{2t}) = 0 \qquad \text{[Equation 3]}$$

In a vector form, this may be represented as Equation 4 below when $h=[0, 1, \beta, \beta^2, \ldots, \beta^{N-1}]$.

$$ch^T = c(h^2)^T = \ldots = c(h^{2t})^T = 0 \qquad \text{[Equation 4]}$$

Again, in order to represent this as a binarization matrix, the binarization matrix $h_b$ of h may be defined. For example, when n=3, and N=8, $h_b$ may be represented as Equation 5 below.

$$h_b = \begin{bmatrix} 0 & 0 & 0 & 0 & 1 & 1 & 1 & 1 \\ 0 & 0 & 1 & 1 & 0 & 0 & 1 & 1 \\ 0 & 1 & 0 & 1 & 0 & 1 & 0 & 1 \end{bmatrix} \qquad \text{[Equation 5]}$$

The code design apparatus of the present disclosure may check whether rows of $h_b$ may be representable in a way by linearly combining each row of $H_\mathcal{A}$ when the parity matrix of the polar code defined as the information set $\mathcal{A}$ is $H_\mathcal{A}$. In this case, all rows of $h_b$ may be included in a linear combination, and only some rows or no rows may be represented. The code design apparatus of the present disclosure may check how many rows are included in the linear combination for $h_b^2, h_b^3, \ldots h_b^j$. The result of this process may be represented as FIG. 2 and specifically, the x-axis of FIG. 3 may indicate an exponent to be applied to $h_b$, and the y-axis may indicate the number of rows that is representable by a linear combination. In this case, the minimum distance of the code may be determined depending on whether the exponent to be included at the maximum is continuous. In the case of FIG. 3, it may be seen that a continuous spectrum is included up to the case where j is 14. However, when j is 15, the minimum distance may not increase even when the continuous spectrum is included thereafter since the parity rows of the BCH are not included. However, the parity matrix may be transformed as shown in Equation 6 below by adding $h_b^{15}$ as the parity of the polar code through adding parity to the polar code.

$$H'_\mathcal{A} = \begin{bmatrix} H_\mathcal{A} \\ h_b^{15} \end{bmatrix} \qquad \text{[Equation 6]}$$

When the parity matrix is transformed in this way, the continuously included spectrum may increase to 22, and thus the minimum distance may increase. Using this transformed parity matrix, the constraint matrix may be derived according to Equation 7 below.

$$V = H'_\mathcal{A} F_N^T \qquad \text{[Equation 7]}$$

Thereafter, the code design apparatus of the present disclosure may complete the code design by obtaining a pre-code satisfying the condition of Equation 8 below.

$$ZV^T = 0 \qquad \text{[Equation 8]}$$

Figure 2:
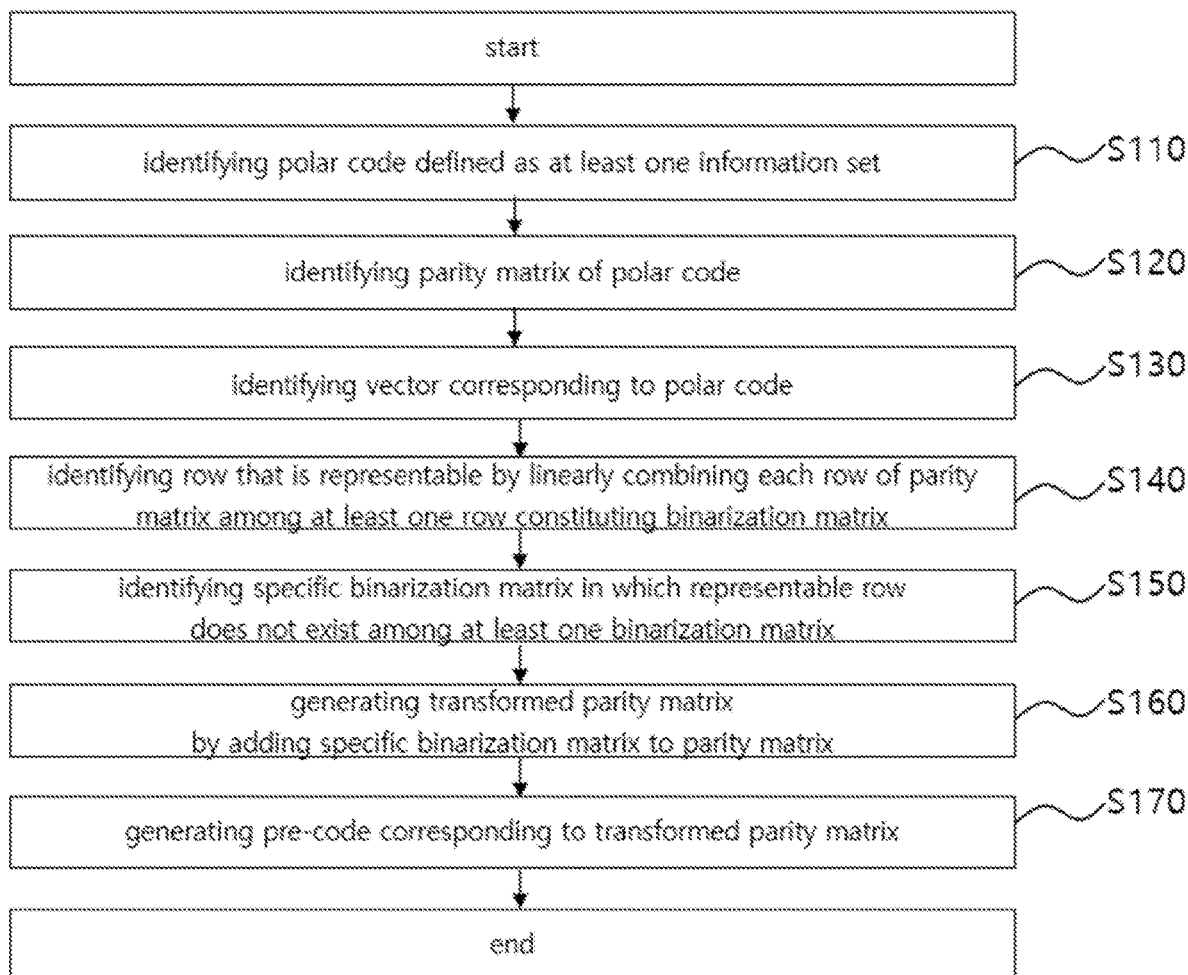
FIG. 2 is a flowchart showing an operation of a code design apparatus according to an exemplary embodiment of the present disclosure.
Figure 3:
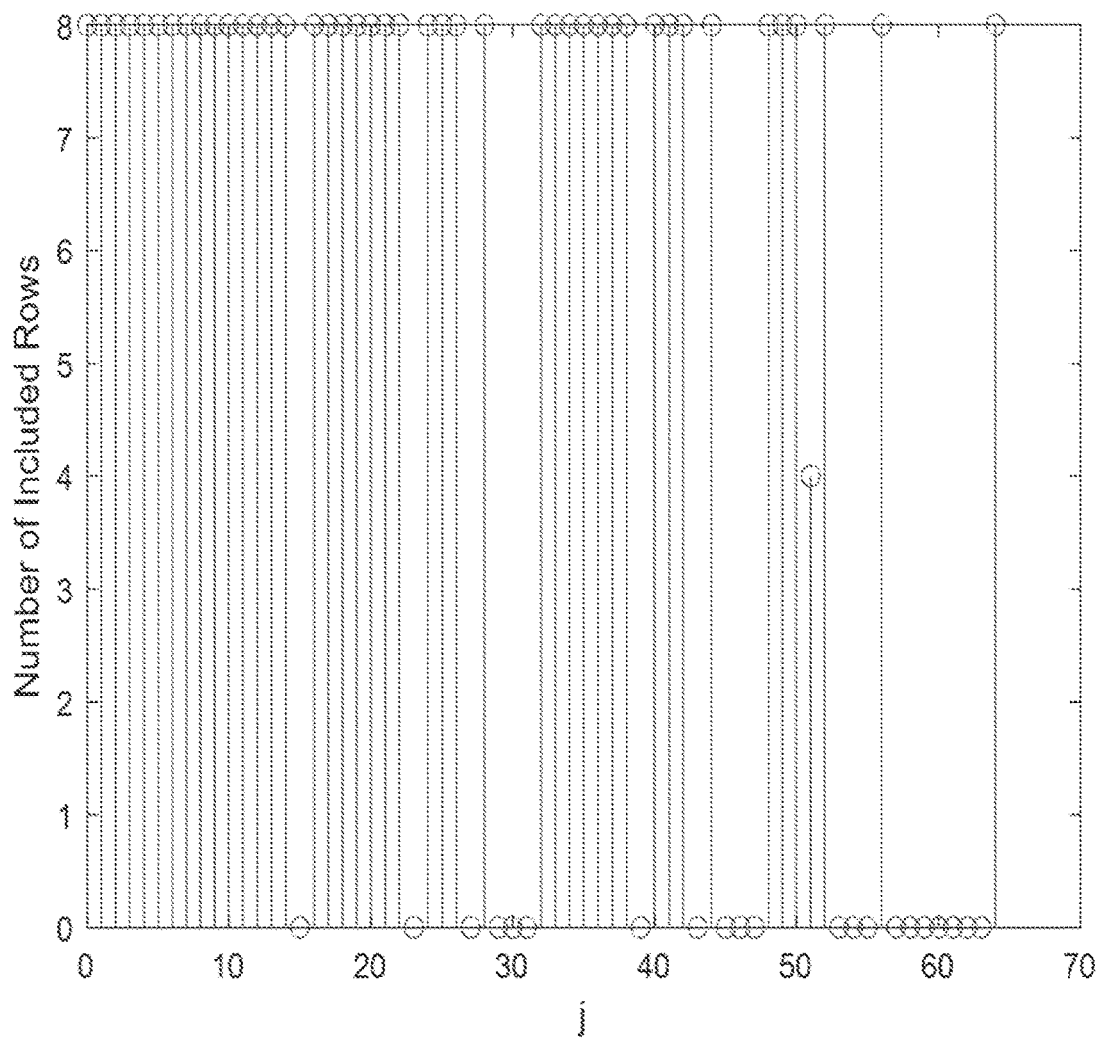
FIG. 3 shows a zero (0) spectrum analysis of BCH included in a parity matrix of a polar code by a code design apparatus according to an exemplary embodiment of the present disclosure.

FIG. 2 is a flowchart showing an operation of a code design apparatus according to an exemplary embodiment of the present disclosure.

In step S110, the code design apparatus (hereinafter referred to as an 'apparatus') may identify the polar code defined as at least one information set.

Herein, when the input is $u_1^N$ in the polar code of view, $u_1^N$ may be divided into three sets such as information set $\mathcal{A}$, frozen set $\mathcal{F}$, and parity set $\mathcal{P}$.

In step S120, the apparatus may identify the parity matrix of the polar code.

Specifically, the apparatus may identify and analyze the parity matrix $H_\mathcal{A}$ of the polar code defined as the information set $\mathcal{A}$. For example, the apparatus may analyze the zero spectrum included in the parity matrix of the polar code.

In step S130, the apparatus may identify the vector corresponding to the polar code.

More specifically, the apparatus may represent the codeword of the BCH code in the form of a polynomial. The codeword of the BCH code represented in the form of a polynomial may satisfy a predetermined condition. In this case, the predetermined condition may be the condition corresponding to Equation 3 described above.

The apparatus may represent the codeword of the polar code in the form of a vector to satisfy the predetermined condition. The operation of the apparatus representing the codeword of the polar code in the form of a vector may include an operation of identifying a vector corresponding to the polar code. Step S130 above may be performed independently or in parallel with step S120.

In addition, the vector may be related to at least one binarization matrix corresponding to at least one exponent. Herein, the binarization matrix may be a binary matrix representation of the codeword of the polar code expressed in vector form.

In step S140, the apparatus may identify a row that is representable in a way by linearly combining each row of the parity matrix among at least one row constituting the binarization matrix.

The apparatus may prior combine each row of the parity matrix identified in step S120 and then determine whether the row constituting the binarization matrix identified in step S130 is representable.

That is, the apparatus may determine whether there is a row that is representable in a way by linearly combining each row of the parity matrix among at least one row constituting the binarization matrix.

In step S150, the apparatus may identify a specific binarization matrix where no representable row exists among at least one binarization matrix.

The apparatus may determine whether there is a row that is not representable in a way by linearly combining each row of the parity matrix among at least one row constituting the binarization matrix.

On the basis of this determination, the apparatus may specify in the parity matrix the row that is not representable in a way by linearly combining each row of the parity matrix.

In step S160, the apparatus may generate the transformed parity matrix by adding the specific binarization matrix to the parity matrix.

The operation of adding the specific binarization matrix to the parity matrix for generating the transformed parity matrix may be performed according to Equation 6 described above.

The transformed parity matrix may include information on an exponent corresponding to the specific binarization matrix among at least one exponent.

In step S170, the apparatus may generate the pre-code corresponding to the transformed parity matrix.

The step of the apparatus generating the pre-code may further include a step of identifying the binarization matrix corresponding to the row that is representable among at least one binarization matrix, a step of identifying the number of representable rows, a step of identifying an exponent of the binarization matrix corresponding to the representable row among at least one exponent, and a step of generating the pre-code based on the identified number and the information on the exponent.

FIG. 3 shows the zero spectrum analysis of BCH included in a parity matrix of a polar code by the code design apparatus according to an exemplary embodiment of the present disclosure.

Referring to FIG. 3, the x-axis indicates an exponent to be applied to $h_b$, and the y-axis indicates the number of rows that are representable by the linear combination. In this case, the minimum distance of the code may be determined depending on whether the exponent to be included at the maximum is continuous. In the case of FIG. 2, it may be seen that a continuous spectrum is included up to the case where j is 14. However, when j is 15, the minimum distance may not increase even when the continuous spectrum is included thereafter since the parity rows of the BCH are not included.

However, when the parity matrix may be transformed by adding $h_b^{15}$ as the parity of the polar code through adding parity to the polar code, the continuously included spectrum may increase to 22 and thus the minimum distance may increase. Using this transformed parity matrix, the code design may be completed by obtaining the constraint matrix and a pre-code that satisfies the following.

Figure 4:
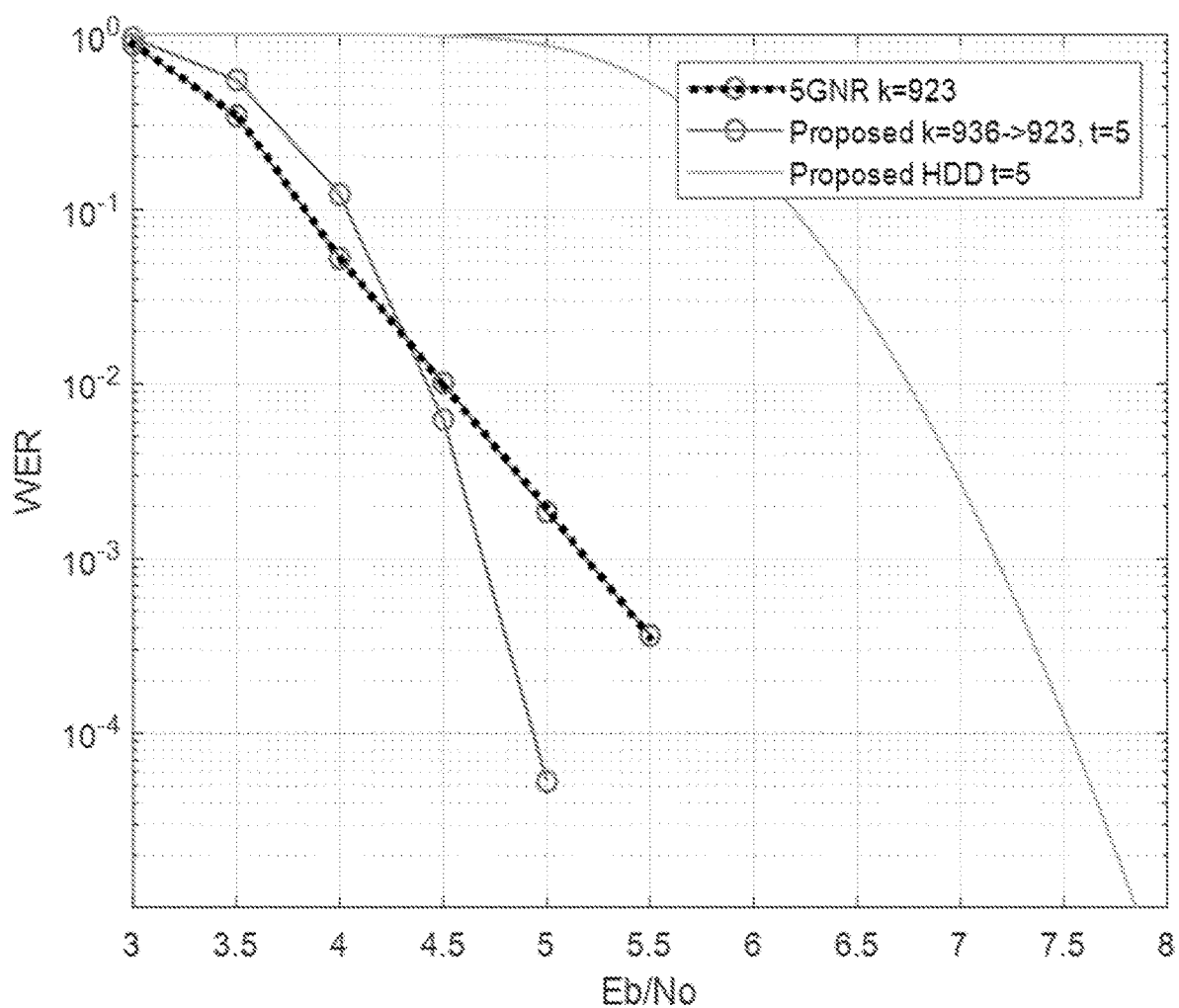
FIG. 4 shows a decoding performance result of a design method performed by a code design apparatus according to an exemplary embodiment of the present disclosure.

FIG. 4 shows a decoding performance result of a design method performed by a code design apparatus according to an exemplary embodiment of the present disclosure.

FIG. 4 shows values of the block error rate (WER:Word Error Ratio) according to receiver sensitivity (Eb/No:Energy per bit to Noise spectral density). This is the result of comparing the performance of the 5GNR standard polar code decoder with the performance (proposed HDD) of performing the hard-decision decoding of the design method of the present disclosure and the performance of performing the soft-decision decoding using the polar code decoding. It may be seen that the Error Ratio value of the proposed soft-decision decoding falls more steeply compared to the 5GNR FEC and it may have a lower WER value when the Eb/No value is greater than 4.5.

The exemplary embodiments of the present disclosure described above are not implemented only through devices and methods, but may be implemented through a program for realizing a function corresponding to the configuration of the exemplary embodiment of the present disclosure or a recording medium in which the program is recorded.

Although the exemplary embodiments of the present disclosure have been described in detail above, the scope of the present disclosure is not limited thereto, and various modifications and improvements of those skilled in the art using the basic concepts of the present disclosure defined in the following claims also belong to the scope of the present disclosure.

The above description is specific exemplary embodiments for implementing the present disclosure. The present disclosure will include not only the above-described exemplary embodiments, but also exemplary embodiments that may be simply changed or easily changed in design. In addition, the present disclosure will include techniques that may be easily modified and implemented using exemplary embodiments. Therefore, the scope of the present disclosure should not be limited to the above-described exemplary embodiments, and should be determined not only by the claims described later but also by the claims equivalent to the claims of the present disclosure.

What is claimed is:

1. An operating method of an apparatus for designing a code, the method comprising:
   receiving an information signal to be transmitted;
   identifying a polar code defined as at least one information set;
   identifying a parity matrix of the polar code;
   identifying a vector corresponding to the polar code wherein the vector is related to at least one binarization matrix corresponding to at least one exponent;
   identifying a row that is representable in a way by linearly combining each row of the parity matrix among at least one row constituting the binarization matrix;
   identifying a specific binarization matrix in which the representable row does not exist among the at least one binarization matrix;
   generating a transformed parity matrix by adding the specific binarization matrix to the parity matrix;
   generating a pre-code corresponding to the transformed parity matrix;
   encoding the information signal based on the generated pre-code and the polar code to generate an error-correction codeword; and
   transmitting the generated error-correction codeword via a transceiver over a communication channel.

2. The method of claim 1, wherein the vector is a vector representation of a polynomial representation for a codeword of the polar code and satisfies a predetermined condition for the codeword.

3. The method of claim 1, wherein the transformed parity matrix comprises information on an exponent corresponding to the specific binarization matrix among the at least one exponent.

4. The method of claim 1, further comprising:
   identifying a binarization matrix corresponding to the representable row among the at least one binarization matrix;
   identifying the number of representable rows;
   identifying an exponent of the binarization matrix corresponding to the representable row among the at least one exponent; and
   generating a pre-code based on the identified number and the information on the exponent.

5. The method of claim 1, wherein the transformed parity matrix is generated on the basis of Equation 1

$$H'_{\mathcal{A}} = \begin{bmatrix} H_{\mathcal{A}} \\ h_b^j \end{bmatrix}$$ [Equation 1]

here, $H_\mathcal{A}$ is the parity matrix, $h_b^j$ is the specific binarization matrix, and j is an exponent corresponding to the specific binarization matrix among the at least one exponent.

6. An apparatus for designing a code, the apparatus comprising:
   a transceiver; and
   a controller that is operatively connected to the transceiver, wherein the controller is configured to:
   receive an information signal to be transmitted;
   identify a polar code defined as at least one information set,
   identify a parity matrix of the polar code,
   identify a vector corresponding to the polar code where the vector is related to at least one binarization vector corresponding to at least one exponent,
   identify a row that is representable in a way by linearly combining each row of the parity matrix among at least one row constituting the binarization matrix,
   identify a specific binarization matrix in which the representable row does not exist among at least one binarization matrix,
   generate a transformed parity matrix by adding the specific binarization matrix to the parity matrix,
   generate a pre-code corresponding to the transformed parity matrix,
   encode the information signal based on the generated pre-code and the polar code to generate an error-correction codeword, and
   control the transceiver to transmit the generated error-correction codeword over a communication channel.

7. The apparatus of claim 6, wherein the vector is a vector representation of a polynomial representation for a codeword of the polar code and satisfies a predetermined condition for the codeword.

8. The apparatus of claim 6, wherein the transformed parity matrix comprises information on an exponent corresponding to the specific binarization matrix among the at least one exponent.

9. The apparatus of claim 6, wherein the controller is further configured to:
   identify a binarization matrix corresponding to the representable row among the at least one binarization matrix,
   identify the number of representable rows,
   identify an exponent of the binarization matrix corresponding to the representable row among the at least one exponent, and
   generate a pre-code based on the identified number and the information on the exponent.

10. The apparatus of claim 6, wherein the transformed parity matrix is generated on the basis of Equation 1

$$H'_\mathcal{A} = \begin{bmatrix} H_\mathcal{A} \\ h_b^j \end{bmatrix} \qquad \text{[Equation 1]}$$

here, $H_\mathcal{A}$ is the parity matrix, $h_b^j$ is the specific binarization matrix, and j is an exponent corresponding to the specific binarization matrix among the at least one exponent.

* * * * *